(12) United States Patent
Aoyama et al.

(10) Patent No.: US 6,980,278 B2
(45) Date of Patent: Dec. 27, 2005

(54) SELF-CLEANING METHOD FOR SEMICONDUCTOR EXPOSURE APPARATUS

(75) Inventors: Ryoichi Aoyama, Tokyo (JP); Toshio Onodera, Tokyo (JP); Yasuhiro Yamamoto, Miyagi (JP); Daigo Hoshino, Kanagawa (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/748,240

(22) Filed: Dec. 31, 2003

(65) Prior Publication Data

US 2004/0239900 A1 Dec. 2, 2004

(30) Foreign Application Priority Data

May 26, 2003 (JP) .............................. 2003-148076

(51) Int. Cl.[7] ....................... G03B 27/42; G03B 27/54; G03B 27/52
(52) U.S. Cl. ............................. 355/53; 355/67; 355/30
(58) Field of Search .............................. 355/30, 67–71, 355/53; 250/492.2; 359/742–743

(56) References Cited

U.S. PATENT DOCUMENTS

| 5,981,960 A | 11/1999 | Ooaeh et al. |
| 6,268,904 B1 * | 7/2001 | Mori et al. ................... 355/53 |
| 6,411,368 B1 * | 6/2002 | Matsumoto et al. .......... 355/67 |

FOREIGN PATENT DOCUMENTS

| JP | 05-335206 | 12/1993 |
| JP | 11-224839 | 8/1999 |
| JP | 2002-246296 | 8/2002 |

* cited by examiner

*Primary Examiner*—Henry Hung Nguyen
(74) *Attorney, Agent, or Firm*—Rabin & Berdo, PC

(57) ABSTRACT

To an original plate holder 16 to which an original pattern plate 15 is set in ordinary exposure, a transmittable plate 20 having a concave-shaped concave portion 22 formed at a middle of a quartz glass plate is set in self-cleaning and irradiated with ultraviolet light emitted from a light source 11. The ultraviolet light is diffused through the concave lens of the transmittable plate 20 and an entire surface of a projection lens 17 is irradiated with it. Accordingly, molecular bonds of a contaminant adhering to the surface of the projection lens 17 are cut off with strong energy of the ultraviolet light, so that the contaminant is decomposed, vaporized, and then removed.

16 Claims, 7 Drawing Sheets

SELF-CLEANING METHOD FOR SEMICONDUCTOR EXPOSURE APPARATUS

BACKGROUND OF THE INVENTION

1. Field of the Invention

The present invention relates to a self-cleaning method for a semiconductor exposure apparatus, and more particularly, it relates to a technology for optically cleaning a semiconductor exposure apparatus to remove a contaminant which adheres in the exposure apparatus.

2. Description of the Related Art

In manufacturing of a semiconductor integrated circuit, there is utilized a photolithographic technology in which an exposure apparatus is used to irradiate with light a photoresist with which a semiconductor wafer is coated and to perform patterning, thereby forming a pattern of an element or a wiring line.

With an increase in integration density of a semiconductor circuit in recent years, there has been a need for forming a finer pattern having a higher density. As a solution for that, a shorter wavelength of an exposure light source has been used. Presently, an ArF excimer light source having a wavelength of 193 nm or an F2 light source having a wavelength of 157 nm is under development.

In an exposure apparatus using such a light source to form fine patterns having a high density, a contaminant in the air which adheres to a surface of an optical element causes harmful effects such as decrease and irregularity in illumination intensity. Therefore, nitrogen purge is carried out by which an optical path in the apparatus is purged with nitrogen gas to suppress the influence of the contaminants. However, even if such nitrogen purge is carried out sufficiently, there occurs such a harmful effect that the illumination intensity is deteriorated or made irregular due to contamination of the optical element when an optical path system is exposed to the air in maintenance or even in routine operation.

Therefore, especially in an exposure apparatus using an exposure light source having a short wavelength, a self-cleaning method referred to as optical cleaning is additionally used, by which ultraviolet light having a wavelength of 200 nm or less is emitted from a light source, and an optical system is irradiated with the ultraviolet light to cut off with strong energy of the ultraviolet light a chemical bond of a carbon compound, which is a main component of contaminants adhering to a surface of this optical system, thereby decomposing the compound.

For example, Jpn. Pat. Appln. KOKAI Publication No. 1993-335206 describes a technology, by which in a projection type exposure apparatus comprising an illumination optical system 1 for emitting illumination light, a filter 3 for passing through it only a wavelength useful to exposure by the illumination light, an exposure mask 4 on which a necessary exposure pattern is formed, a projection optical system 5 for projecting the exposure pattern to a subject 10 to be processed, a holder 6 to which the subject to be processed is mounted, and a stage 7 for moving the holder 6 with respect to the projection optical system 5. In its self-cleaning, an ultraviolet light filter 2 is placed in an optical path in place of the filter 3 and the exposure mask 4, so that the holder 6 is irradiated with ultraviolet light that has passed through this ultraviolet filter 2 through the projection optical system 5 in order to oxidize and remove organic foreign matters and impurities adhering to this holder 6.

However, a conventional projection type exposure apparatus has the following problems. That is, since the ultraviolet light filter 2 is placed on the optical path in place of the filter 3 and the exposure mask 4, the same positions along the same optical path as those in the case of ordinary exposure are irradiated with ultraviolet light for optical cleaning. Therefore, it is impossible to remove the contaminant adhering to a position other than the ordinary exposure path, so that the remaining contaminant might move to the exposure path and it might have a bad influence on the exposure path.

SUMMARY OF THE INVENTION

To solve these problems, the present invention provides a self-cleaning method for a semiconductor exposure apparatus comprising a light source for emitting ultraviolet light for exposure, an optical system for guiding ultraviolet light emitted from the light source to an exposure mask on which an exposure pattern is formed, and a projection lens for projecting the exposure pattern to a subject to be processed, the method comprising the steps of arranging, in place of the exposure mask, a transmittable plate for diffusing ultraviolet light guided by the optical system and irradiating the projection lens with the ultraviolet light; and irradiating an entire surface of the projection lens with the ultraviolet light emitted from the light source and diffused by the transmittable plate to optically clean a surface of the projection lens.

The present invention also provides a self-cleaning method for a semiconductor exposure apparatus comprising a light source for emitting ultraviolet light for exposure, an optical system for guiding ultraviolet light emitted from the light source to an exposure mask on which an exposure pattern is formed, and a projection lens for projecting the exposure pattern to a subject to be processed, the method comprising the steps of arranging, in place of the exposure mask, a transmittable plate for converging ultraviolet light guided by the optical system and irradiating the projection lens with the ultraviolet light; and irradiating a middle of the projection lens with the ultraviolet light emitted from the light source and converged by the transmittable plate to optically clean an inside of the projection lens.

The present invention further provides a self-cleaning transmittable plate in a semiconductor exposure apparatus comprising a light source for emitting ultraviolet light for exposure, an optical system for guiding ultraviolet light emitted from the light source to an exposure mask on which an exposure pattern is formed, and a projection lens for projecting the exposure pattern to a subject to be processed, the self-cleaning transmittable plate being arranged in place of the exposure mask to clean the projection lens with the ultraviolet light, the self-cleaning transmittable plate diffusing or converging ultraviolet light guided by the optical system to irradiate the projection lens with the ultraviolet light.

According to the present invention, the self-cleaning method and self-cleaning transmittable plate for a semiconductor exposure apparatus are configured as described above, the following actions take place in self-cleaning.

Ultraviolet light for exposure emitted from the light source is guided through the optical system to a self-cleaning transmittable plate set at a position where an exposure mask is mounted. The ultraviolet light incident upon the transmittable plate is diffused or converged by this transmittable plate and the projection lens is irradiated with it. Therefore, portions of a periphery and an inside of the projection lens through which no ultraviolet light passes in ordinary exposure are also irradiated with the ultraviolet light. Accordingly, chemical bonds of a contaminant adhering to a surface of the projection lens are cut off with strong energy of the ultraviolet light, so that the contaminant is decomposed, vaporized, and then removed.

BRIEF DESCRIPTION OF THE DRAWINGS

FIG. 1A is an overall configuration diagram of a semiconductor exposure apparatus, FIG. 1B is a plan view of a transmittable plate, and FIG. 1C is a cross-sectional view taken along the line X—X of FIG. 1B;

FIG. 2A is a plan view of a transmittable plate 20A, and FIG. 2B is its cross-sectional view;

FIG. 3A is a plan view of a transmittable plate 20B, and FIG. 3B is its cross-sectional view;

FIG. 4A is a plan view of a transmittable plate 20C, and FIG. 4B is its cross-sectional view;

FIG. 5A is a plan view of a transmittable plate 20D, and FIG. 5B is its cross-sectional view; FIG. 6A is a plan view of a transmittable plate 20E, and FIG. 6B is its cross-sectional view.

DETAILED DESCRIPTION OF THE INVENTION (First Embodiment)

Figure 1A:
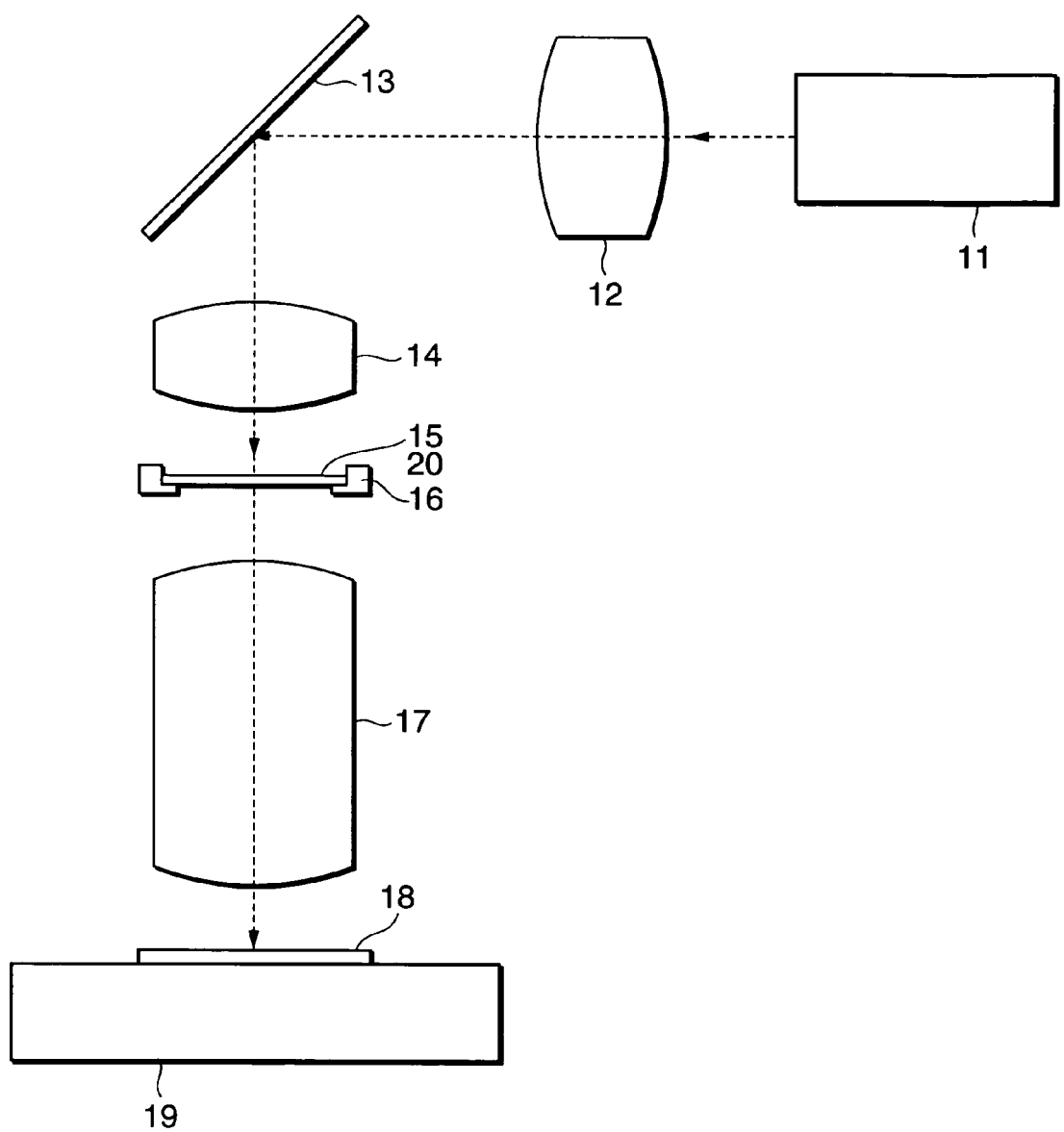
FIGS. 1A–1C are illustrations for showing a first embodiment of the present invention.
Figure 1B:
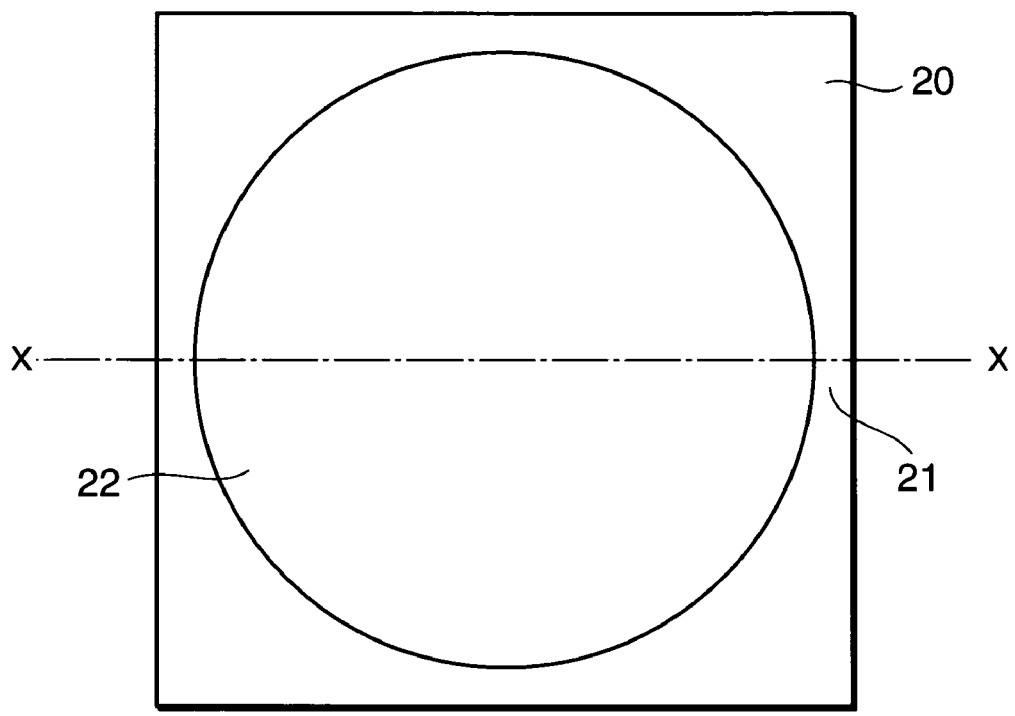
Figure 1C:
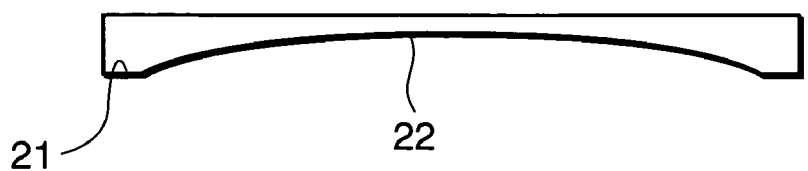

FIGS. 1A–1C are configuration diagrams for outlining a semiconductor exposure apparatus according to the first embodiment of the present invention. FIG. 1A is an overall configuration diagram, FIG. 1B is a plan view of a transmittable plate 20, and FIG. 1C is a cross-sectional view taken along the line X—X of FIG. 1B.

As shown in FIG. 1A, this semiconductor exposure apparatus has a measurement-purpose light source 11 for emitting ultraviolet light having an ultra-short wavelength, such as ArF excimer light having a wavelength of 193 nm or F2 light having a wavelength of 157 nm. On an output side of the light source 11 a light source-side optical system 12 is arranged, on an output side of which a mirror 13 is provided. Ultraviolet light whose optical path has been altered by the mirror 13 by 90 degrees is guided to a condenser lens 14, by which condenser lens 14 the ultraviolet light is output as an incoherent and parallel light. On an output side of the condenser lens 14, an original plate holder 16 is provided for setting an original pattern plate 15 to it.

Furthermore, on an output side of the original plate holder 16, a projection lens 17 is arranged for correctly reducing a circuit pattern on the original pattern plate 15 and projecting it onto a surface of a subject to be processed. On a downstream side of the projection lens 17, a stage 19 is provided for mounting on it a wafer 18, which is the subject to be processed, and moving it with respect to this projection lens 17.

On the other hand, in place of the original pattern plate 15, the transmittable plate 20 shown in FIGS. 1B and 1C is set to the original plate holder 16 and used in self-cleaning of the semiconductor exposure apparatus of FIG. 1A. This transmittable plate 20 has the same size (e.g., square having about a thickness of about 5 mm and a side length of about 150 mm) and is made of the same material (e.g., quartz glass) as the original pattern plate 15, which is used in exposure processing. However, such a surface of the transmittable plate 20 as to be on the side of the condenser lens 14 is formed flat, while in its surface on the side of the projection lens 17 except its peripheral handling portion 21, a concave portion 22 is formed which provides a concave lens having a diameter of, for example, 130 mm.

The following will describe operations of this semiconductor exposure apparatus. In ordinary exposure, the original pattern plate 15 having a predetermined circuit pattern formed on it is set to the original plate holder 16 and also the wafer 18 is mounted on the stage 19, whereupon the light source 11 emits ultraviolet light. Accordingly, the ultraviolet light emitted from the light source 11 passes through the optical system 12 on the side of the light source, the mirror 13, and the condenser lens 14 to provide incoherent and parallel light, with which the original pattern plate 15 is irradiated. Furthermore, the ultraviolet light having passed through the original pattern plate 15 is incident upon the projection lens 17 as the parallel light.

The circuit pattern on the original pattern plate 15 is reduced by the projection lens 17 and projected onto the wafer 18. By moving the stage 19 sequentially from position to position and opening/closing a shutter, not shown, at each of these positions, the circuit pattern is exposed onto a surface of the wafer 18. This causes a plurality of identical circuits to be exposed onto the wafer 18.

To clean this semiconductor exposure apparatus and to remove a contaminant on the projection lens 17 or the stage 19 of the exposure apparatus, the original pattern plate 15 is detached and, in place of it, the transmittable plate 20 is set to the original plate holder 16. Then, ultraviolet light is emitted from the light source 11. Accordingly, the ultraviolet light emitted from the light source 11 passes through the optical system 12 on the side of the light source, the mirror 13, and the condenser lens 14 to provide incoherent and parallel light, with which the transmittable plate 20 is irradiated.

The ultraviolet light with which the transmittable plate 20 is irradiated passes through the concave portion 22 formed in this transmittable plate 20, and is refracted outward and diffused to irradiate an entire surface of the projection lens 17. Accordingly, molecular bonds of the contaminant adhering to the surface of the projection lens 17 are cut off with strong energy of the ultraviolet light, so that the contaminant is decomposed, vaporized, and then removed.

In the above constitution, this semiconductor exposure apparatus according to the first embodiment has the transmittable plate 20 which is set to the original plate holder 16 and on which there is formed the concave lens-shaped concave portion 22 for diffusing outward and emitting ultraviolet light of an ultra-short wavelength incident as parallel light from the light source side. It is thus possible to irradiate even such a portion as to be irradiated with no ultraviolet light in ordinary exposure with optical-cleaning ultraviolet light, thereby providing such a merit as to enable effective self-cleaning of the projection lens 17. Further, the transmittable plate 20 is made of quartz, so that ultraviolet light passing through it attenuates less, thus giving a merit of high cleaning power.

(Second Embodiment)

Figure 2A:
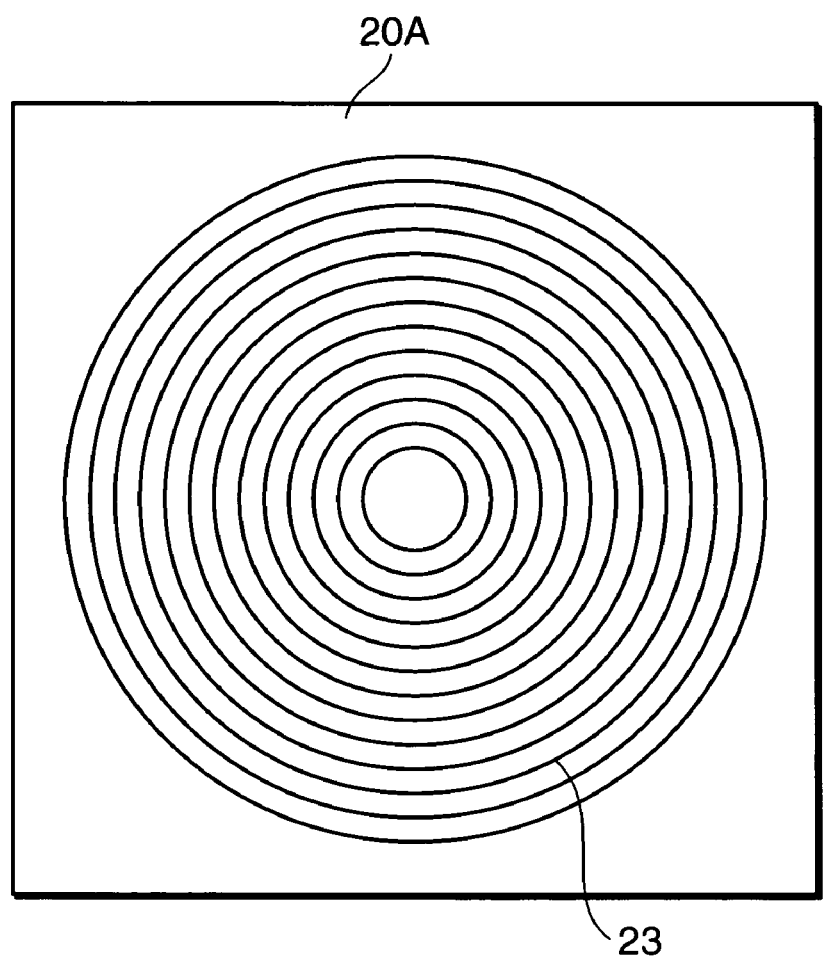
FIGS. 2A–2B are illustrations for showing a second embodiment of the present invention.
Figure 2B:
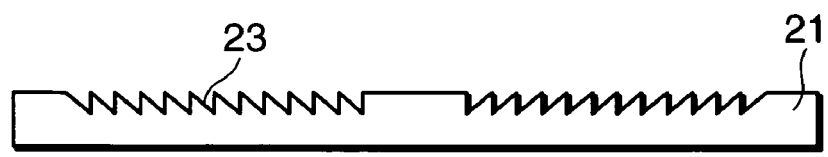

FIGS. 2A–2B show a transmittable plate 20A according to the second embodiment of the present invention, FIG. 2A is its plan view, and FIG. 2B is a cross-sectional view which passes through a central axis of the transmittable plate 20A and which is perpendicular to its plane.

This transmittable plate 20A is used for the same purpose as the transmittable plate 20 of FIG. 1B and has a Fresnel lens 23 formed in its upper surface in place of the concave lens-shaped concave portion 22, which Fresnel lens 23 comprises bracelet-shaped concave lenses concentrically arranged.

This transmittable plate 20A is made of the same material and has the same size as the transmittable plate 20 of FIG. 1B and can be manufactured by concentrically grooving a surface of a square-shaped quartz glass plate having, for example, a thickness of about 5 mm and a side length of about 150 mm in such a manner that a cross section of the plate may be of a saw-tooth. Further, the transmittable plate 20A can also be manufactured by sticking a Fresnel lens made of a heat-resistant transparent resin on the quartz glass plate.

This transmittable plate 20A according to the second embodiment has about the same self-cleaning effects as the transmittable plate 20 according to the first embodiment and also has a merit that it can be made thinner than the transmittable plate 20 and is capable of diffusing ultraviolet light wider than that.

(Third Embodiment)

Figure 3A:
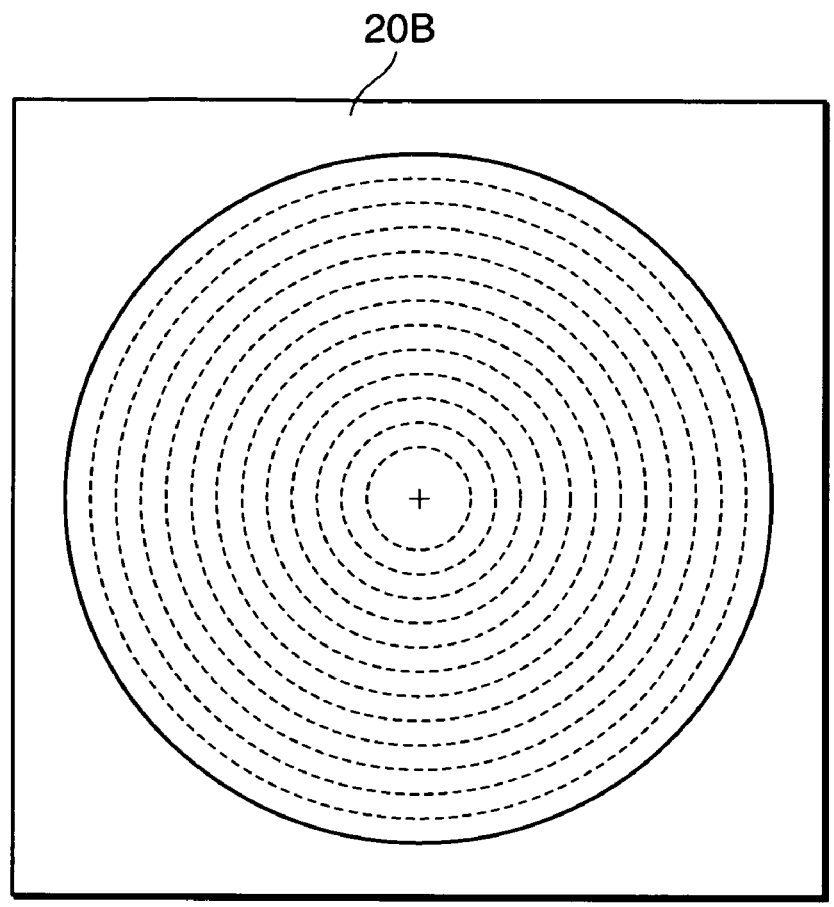
FIGS. 3A–3B are illustrations for showing a third embodiment of the present invention.
Figure 3B:
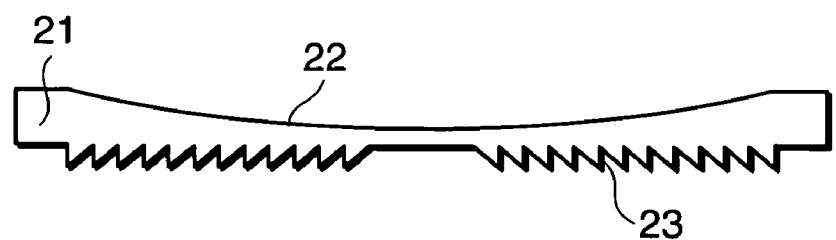

FIGS. 3A–3B show a transmittable plate 20B according to the third embodiment of the present invention, FIG. 3A is its plan view, and FIG. 3B is a cross-sectional view which passes through a central axis of the transmittable plate 20B and which is perpendicular to its plane.

This transmittable plate 20B is used for the same purpose as the transmittable plate 20 of FIG. 1B and has a concave lens-shaped concave portion 22 in an upper surface thereof and a Fresnel lens 23 formed in a back surface thereof, which Fresnel lens comprises bracelet-shaped concave lenses concentrically arranged as shown in FIG. 3.

This transmittable plate 20B is made of the same material and has the same size as the transmittable plate 20 of FIG. 1B and can be manufactured by grinding an upper surface of a square-shaped quartz glass plate having, for example, a thickness of about 5 mm and a side length of about 150 mm so that a concave lens may be formed in the upper surface and concentrically grooving the back surface in such a manner that a cross section of the plate may be of a saw-tooth.

This transmittable plate 20B according to the third embodiment has a merit that it can be made thinner than the transmittable plates 20 and 20A according to the respective first and second embodiments and has about the same self-cleaning effects as these transmittable plates 20 and 20A.

(Fourth Embodiment)

A main purpose of the transmittable plates 20, 20A, and 20B used in the first, second, and third embodiments respectively is to irradiate an entire surface of a projection lens 17 with optical-cleaning ultraviolet light to remove a contaminant on a periphery of a surface thereof. However, the projection lens 17 is constituted of a plurality of lenses, so that even if the entire surface of this projection lens 17 is irradiated with ultraviolet light, entire surfaces of the inner side lenses are not always irradiated with it. Instead, if ultraviolet light is diffused and the surface of the projection lens 17 is irradiated with it, the inner side lenses may be irradiated with it intensively. On the other hand, it can be supposed that contaminants adhere to the surfaces of the respective inner side lenses.

The fourth and subsequent embodiments aim at cleaning of the inner lenses of the projection lens 17 and can each be used together with any one of the first through third embodiments to improve self-cleaning effects of the semiconductor exposure apparatus.

Figure 4A:
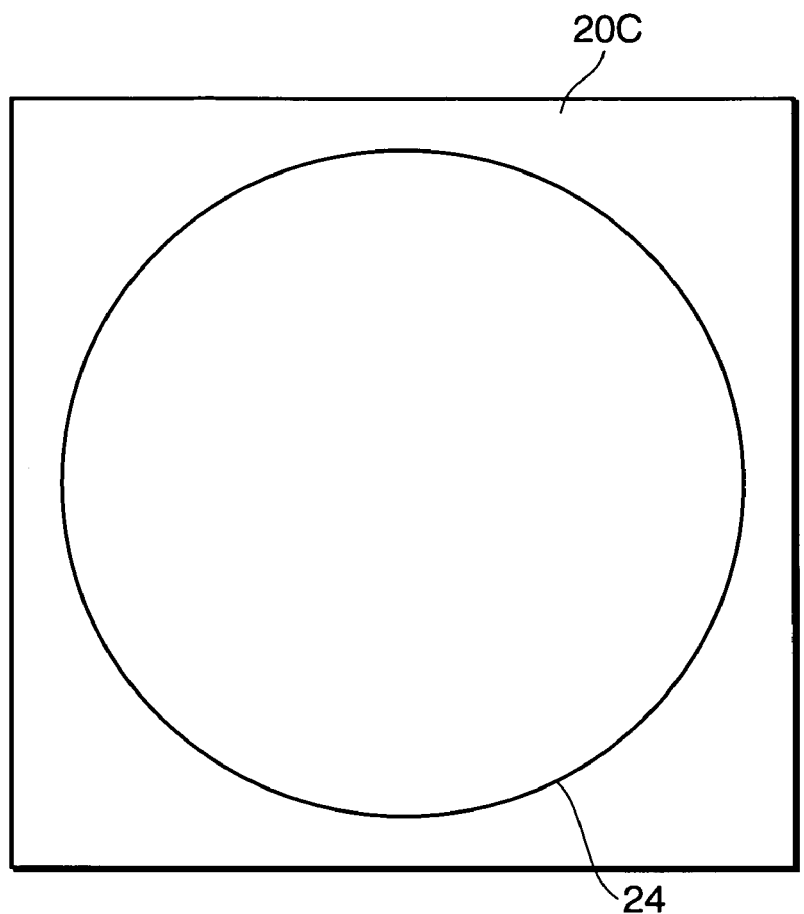
FIGS. 4A–4B are illustrations for showing a fourth embodiment of the present invention.
Figure 4B:
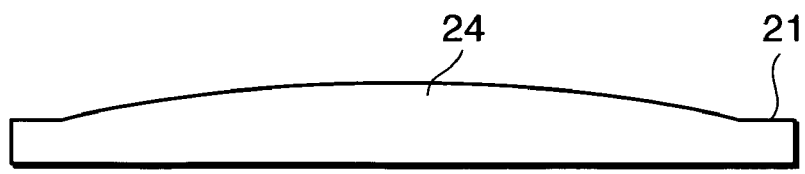

FIGS. 4A–4B show a transmittable plate 20C according to the fourth embodiment of the present invention, FIG. 4A is its plan view, and FIG. 4B is a cross-sectional view which passes through a central axis of the transmittable plate 20C and which is perpendicular to its plane.

In place of an original pattern plate 15, this transmittable plate 20C is set to an original plate holder 16 and used in self-cleaning of the semiconductor exposure apparatus of FIG. 1A. This transmittable plate 20C is, similar to the original pattern plate 15, made of square-shaped quartz glass having a side length of about 150 mm and has on an upper surface thereof except a peripheral handling portion 21 a convex portion 24 that constitutes a convex lens having a diameter of, for example, 130 mm.

At this transmittable plate 20C, ultraviolet light with which its surface is irradiated in self-cleaning passes through the convex portion 24 formed at its middle and is refracted and converged toward its center, so that a middle of the projection lens 17 is irradiated with the ultraviolet light. The ultraviolet light thus passes through an optical path different from that in the case of ordinary exposure and the plurality of lenses of the projection lens 17 is irradiated with it. Accordingly, molecular bonds of a contaminant adhering to portions irradiated with ultraviolet light are cut off with strong energy of the ultraviolet light, so that the contaminant is decomposed, vaporized, and then removed.

As described above, the transmittable plate 20C according to the fourth embodiment is set to an original plate holder 16 and has the convex lens-shaped convex portion 24 for inward convergence and emission of ultraviolet light having an ultra-short wavelength incident upon it as parallel light from a light source side. Accordingly, it is possible to irradiate with optical-cleaning ultraviolet light even such an inner side portion of the projection lens 17 as to be irradiated with no ultraviolet light in ordinary exposure or in the first through third embodiments. Therefore, the present embodiment can be used together with any one of the first through third embodiments, to give a merit of effective self-cleaning of the inner side of the projection lens 17.

(Fifth Embodiment)

Figure 5A:
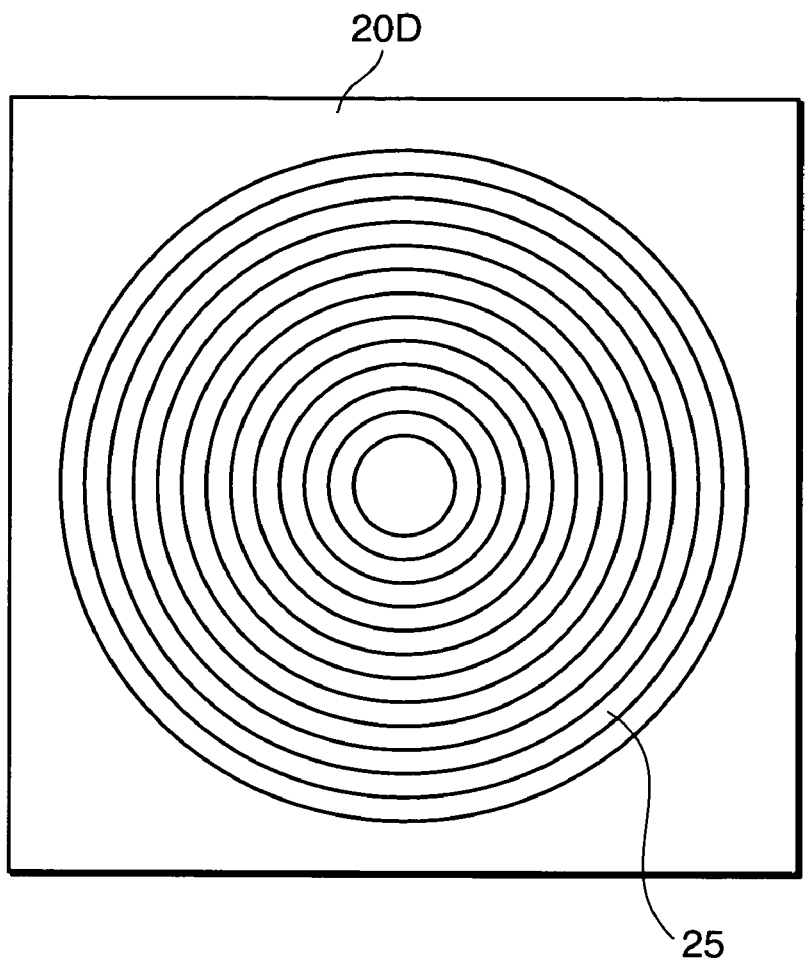
FIGS. 5A–5B are illustrations for showing a fifth embodiment of the present invention.
Figure 5B:
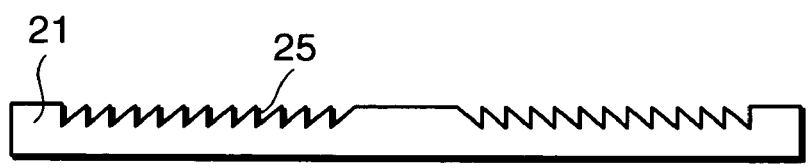

FIGS. 5A–5B show a transmittable plate 20D according to the fifth embodiment of the present invention, FIG. 5A is its plan view, and FIG. 5B is a cross-sectional view which passes through a central axis of the transmittable plate 20D and which is perpendicular to its plane.

This transmittable plate 20D is used for the same purpose as the transmittable plate 20C of FIG. 4 and has a Fresnel lens 25 formed on its upper surface in place of the convex lens-shaped convex portion 24, which Fresnel lens 25 comprises bracelet-shaped convex lenses concentrically arranged.

This transmittable plate 20D is made of the same material and has the same size as the transmittable plate 20A of FIG. 2. The transmittable plate 20D can be manufactured by concentrically grooving a surface of a square-shaped quartz glass plate having, for example, a thickness of about 5 mm and a side length of about 150 mm in such a manner that a cross section of the plate may be of a saw-tooth. Furthermore, the transmittable plate 20D can also be manufactured by sticking a Fresnel lens made of a heat-resistant transparent resin on the quartz glass plate.

This transmittable plate 20D according to the fifth embodiment has a merit that it can be made thinner than the transmittable plate 20C according to the fourth embodiment and also has a merit that it has about the same self-cleaning effects as this transmittable plate 20C.

(Sixth Embodiment)

Figure 6A:
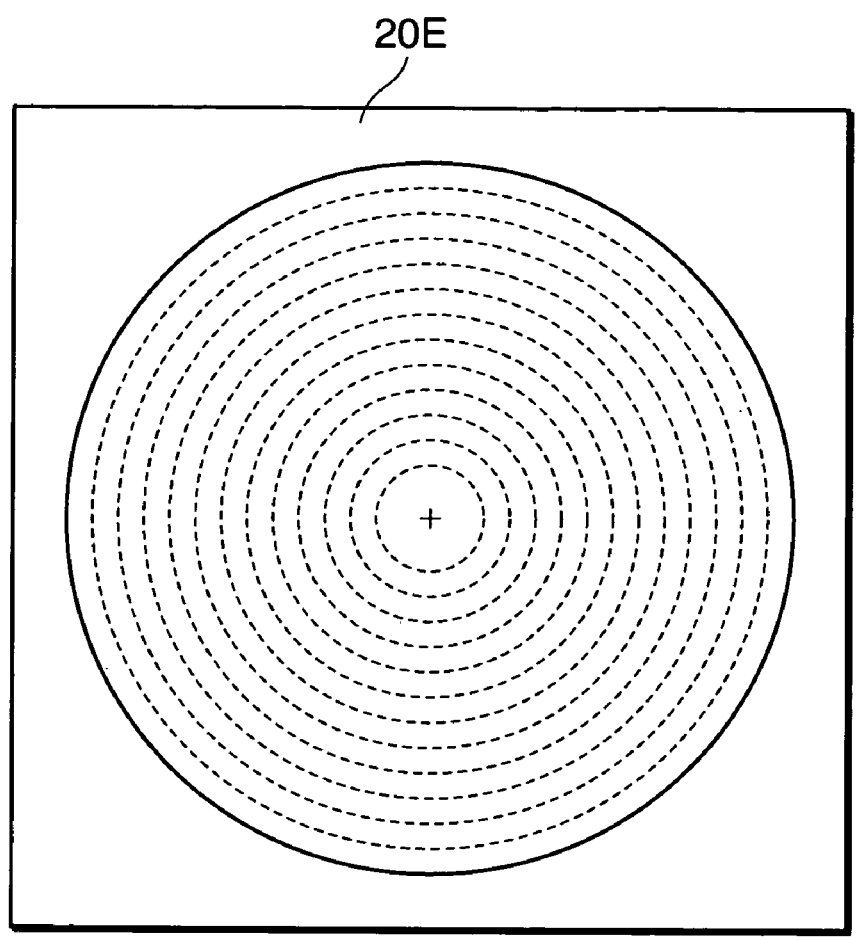
FIGS. 6A–6B are illustrations for showing a sixth embodiment of the present invention.
Figure 6B:
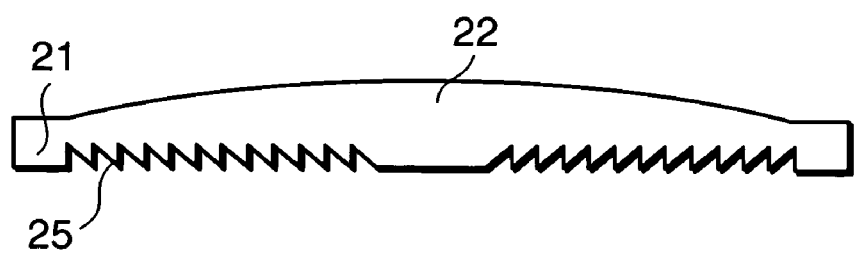

FIGS. 6A–6B show a transmittable plate 20E according to the sixth embodiment of the present invention, FIG. 6A is its plan view, and FIG. 6B is a cross-sectional view which passes through a central axis of the transmittable plate 20E and which is perpendicular to its plane.

This transmittable plate 20E is used for the same purpose as the transmittable plate 20C of FIG. 4 and has a convex lens-shaped convex portion 24 on its upper surface and a Fresnel lens 25 formed on its back surface, which Fresnel lens 25 comprises bracelet-shaped convex lenses concentrically arranged as shown in FIG. 5.

This transmittable plate 20E is made of the same material and has the same size as the transmittable plate 20B of FIG. 3 and can be manufactured by grinding an upper surface of a square-shaped quartz glass plate having, for example, a side length of about 150 mm so that a concave lens may be formed in the upper surface and concentrically grooving its back surface in such a manner that a cross section of the plate may be of a saw-tooth.

This transmittable plate 20E according to the sixth embodiment has a merit that it can be made thinner than the transmittable plates 20C and 20D according to the respective fourth and fifth embodiments and has about the same self-cleaning effects as these transmittable plates 20C and 20D.

It is to be noted that the present invention is not limited to the embodiments described above but can be modified variously. Possible variants include the following.

A: Although the semiconductor exposure apparatus of FIG. 1 is constituted so that during self-cleaning of the apparatus, ultraviolet is incident upon a flat face side of the transmittable plate 20 and emitted from the side of the concave portion 22, it may be set oppositely so that ultraviolet light would be incident upon the side of the concave portion 22. Similarly, the transmittable plates 20A–20E shown in FIGS. 2–6 respectively may be set either way.

B: The size and the material of the transmittable plate 20 etc. are not limited to those given as an example. They may be arbitrary as far as they enable convergence and transmission of ultraviolet light at a low loss.

In present invention, in place of an exposure mask, a transmittable plate may be arranged so that ultraviolet light emitted from a light source may be diffused through this plate and a projection lens may be irradiated with it. It is thus possible to optically clean a surface of the projection lens efficiently using a simple configuration.

The transmittable plate can be constituted of a quartz glass plate having a lens-shaped concave portion in its surface or a quartz glass plate having bracelet-shaped concave lenses concentrically arranged in its surface, so that it is possible to irradiate an entire surface of the projection lens with ultraviolet light efficiently with little attenuation of the ultraviolet light.

The transmittable plate may be made of a quartz glass plate having a lens-shaped concave portion formed in one surface and bracelet-shaped concave lenses formed concentrically in the other surface of the plate, so that it is possible to efficiently diffuse ultraviolet light more widely.

In place of the exposure mask, the transmittable plate is may be arranged so that ultraviolet light emitted from the light source may be converged through this plate and the projection lens may be irradiated with it. It is thus possible to optically clean surfaces of inner side lenses of the projection lens efficiently using a simple configuration.

The transmittable plate can be constituted of a quartz glass plate having a lens-shaped convex portion on its surface or a quartz glass plate having bracelet-shaped convex lenses concentrically arranged on its surface, so that it is possible to irradiate a middle of the projection lens with ultraviolet light efficiently with little attenuation of the ultraviolet light.

The transmittable plate may be made of a quartz glass plate having a lens-shaped convex portion formed on one surface and bracelet-shaped convex lenses formed concentrically on the other surface of the plate, so that it is possible to efficiently converge ultraviolet light to a smaller range.

In place of the exposure mask, the transmittable plate may be arranged so that ultraviolet light emitted from the light source may be diffused or converged through this plate and the projection lens may be irradiated with it. It is thus possible to optically clean the surface or the inner side of the projection lens efficiently using a simple configuration.

The self-cleaning transmittable plate may be made of a quartz glass plate having a lens-shaped concave or convex portion on its surface or a quartz glass plate having bracelet-shaped concave or convex lenses concentrically arranged on a surface thereof. It is thus possible to diffuse or converge ultraviolet light and irradiate the projection lens with it efficiently with little attenuation of the ultraviolet light.

What is claimed is:

1. A self-cleaning method for a semiconductor exposure apparatus comprising a light source for emitting ultraviolet light for exposure, an optical system for guiding ultraviolet light emitted from the light source to an exposure mask on which an exposure pattern is formed, and a projection lens for projecting the exposure pattern to a subject to be processed, the method comprising:

arranging, at a position where the exposure mask is to be disposed, a transmittable plate for diffusing ultraviolet light guided by the optical system and irradiating the projection lens with it, the transmittable plate being made of a quartz glass plate having a lens-shaped concave portion on one surface thereof and bracelet-shaped concave lenses concentrically arranged on the other surface thereof; and irradiating an entire surface of the projection lens with the ultraviolet light emitted from the light source and diffused by the transmittable plate to optically clean a surface of the projection lens, and wherein the transmittable plate for self-cleaning includes a Fresnel lens made of a heat resistant transparent resin.

2. A self-cleaning method according to claim 1, wherein the ultraviolet light is an Are excimer light having a wavelength of 193 nm.

3. A self-cleaning method according to claim 1, wherein the ultraviolet light is an F2 light having a wavelength of 157 nm.

4. A self-cleaning method for a semiconductor exposure apparatus comprising a light source for emitting ultraviolet light for exposure, an optical system for guiding ultraviolet light emitted from the light source to an exposure mask on which an exposure pattern is formed, and a projection lens for projecting the exposure pattern to a subject to be processed, the method comprising:

arranging, at a position where the exposure mask is to be disposed, a transmittable plate for converging ultraviolet light guided by the optical system and irradiating the projection lens with it, wherein the transmittable plate is made of a quartz glass plate having a lens-shaped convex portion on one surface thereof and bracelet-shaped convex lenses concentrically arranged on the other surface thereof; and irradiating an middle of the projection lens with the ultraviolet light emitted from the light source and converged by the transmittable plate to optically clean an inside of the projection lens, and wherein the transmittable plate for self-cleaning includes a Fresnel lens made of a heat-resistant transparent resin.

5. A self-cleaning method according to claim 4, wherein the ultraviolet light is an ArF excimer light having a wavelength of 193 nm.

6. A self-cleaning method according to claim 4, wherein the ultraviolet light is an F2 light having a wavelength of 157 nm.

7. A semiconductor exposure apparatus with a self-cleaning function comprising:

a light source for emitting ultraviolet light for exposure;
an exposure mask on which an exposure pattern is formed;
an optical system for guiding the ultraviolet light emitted from the light source to the exposure mask;
a projection lens for projecting the exposure pattern to a subject to be processed; and
a transmittable plate for self-cleaning being arranged at a position where the exposure mask is to be disposed to clean the projection lens with the ultraviolet light,
wherein the transmittable plate for self-cleaning diffuses or converts ultraviolet light guided by the optical system to irradiate the projection lens with the ultraviolet light, and wherein the self-cleaning transmittable plate is made of a quartz glass plate having a lens-shaped concave portion on one surface thereof and bracelet-shaped concave lenses concentrically arranged on the other surface thereof, and
wherein the transmittable plate for self-cleaning includes a Fresnel lens made of a heat-resistant transparent resin.

8. A semiconductor exposure apparatus according to claim 7, wherein the ultraviolet light is an ArF excimer light having a wavelength of 193 nm.

9. A semiconductor exposure apparatus according to claim 7, wherein the ultraviolet light is an F2 light having a wavelength of 157 nm.

10. A semiconductor exposure apparatus with a self-cleaning function comprising:

a light source for emitting ultraviolet light for exposure;
an exposure mask on which an exposure pattern is formed;
an optical system for guiding the ultraviolet light emitted from the light source to the exposure mask;
a projection lens for projecting the exposure pattern to a subject to be processed; and
a transmittable plate for self-cleaning being arranged at a position where the exposure mask is to be disposed to clean the projection lens with the ultraviolet light,
wherein the transmittable plate for self-cleaning diffuses or converts ultraviolet light guided by the optical system to irradiate the projection lens with the ultraviolet light, and
wherein the transmittable plate for self-cleaning is made of a quartz glass plate having a lens-shaped convex portion on one surface thereof and bracelet-shaped convex lenses concentrically arranged on the other surface thereof, and
wherein the transmittable plate for self-cleaning includes a Fresnel lens made of a heat-resistant transparent resin.

11. A semiconductor exposure apparatus according to claim 10, wherein the ultraviolet light is an ArF excimer light having a wavelength of 193 nm.

12. A semiconductor exposure apparatus according to claim 10, wherein the ultraviolet light is an F2 light having a wavelength of 157 nm.

13. A self-cleaning method according to claim 1, wherein the transmittable plate for self-cleaning includes a Fresnel lens made of a heat resistant transparent resin.

14. A self-cleaning method according to claim 4, wherein the transmittable plate for self-cleaning includes a Fresnel lens made of a heat-resistant transparent resin.

15. A semiconductor exposure apparatus according to claim 7, wherein the transmittable plate for self-cleaning includes a Fresnel lens made of a heat-resistant transparent resin.

16. A semiconductor apparatus according to claim 10, wherein the transmittable plate for self-cleaning includes a Fresnel lens made of a heat-resistant transparent resin.

* * * * *